United States Patent [19]

Besson

[11] 4,135,108
[45] Jan. 16, 1979

[54] QUARTZ RESONATOR WITH ELECTRODES THAT DO NOT ADHERE TO THE CRYSTAL

[75] Inventor: Raymond J. Besson, Besancon, France

[73] Assignee: L'Etat Francais represente par le Delegue Ministeriel, Paris, France

[21] Appl. No.: 759,488

[22] Filed: Jan. 14, 1977

[30] Foreign Application Priority Data

Jan. 16, 1976 [FR] France .................. 76 01035
May 31, 1976 [FR] France .................. 76 16289

[51] Int. Cl.² .......................................... H01L 41/10
[52] U.S. Cl. ................................ 310/344; 310/349; 310/352; 310/369; 310/361
[58] Field of Search ............ 310/344, 352, 346–350

[56] References Cited

U.S. PATENT DOCUMENTS

| Re. 26,707 | 11/1969 | Cutler et al. ............ 310/349 X |
| 1,908,320 | 5/1933 | Conklin ...................... 310/347 |
| 2,076,060 | 4/1937 | Bechmann et al. ........ 310/350 |
| 2,542,651 | 2/1951 | Franklin et al. .......... 310/347 |
| 2,677,775 | 5/1954 | Font ............................ 310/349 |
| 2,807,731 | 9/1957 | Minnich .................. 310/349 X |

*Primary Examiner*—Mark O. Budd
*Attorney, Agent, or Firm*—Lewis H. Eslinger

[57] ABSTRACT

Quartz resonator with electrodes that do not adhere to the crystal. Quartz resonator having improved medium-term and long-term stabilities and permitting easier placing on frequency. The resonator comprises, inside a tight housing 1, a condenser formed by two disks 3, 4 made of a dielectric material and separated by a removable ring 2 which determines the spacing between the disks 3 and 4. Electrodes are formed by metallization on the faces of the disks 3 and 4 located opposite a quartz crystal 1 enclosed in said condenser. The spacings between the crystal 1 and the disks 3 and 4 are considerably less than 1 millimeter. Application, for example, in the fields of telecommunications and radars.

33 Claims, 23 Drawing Figures

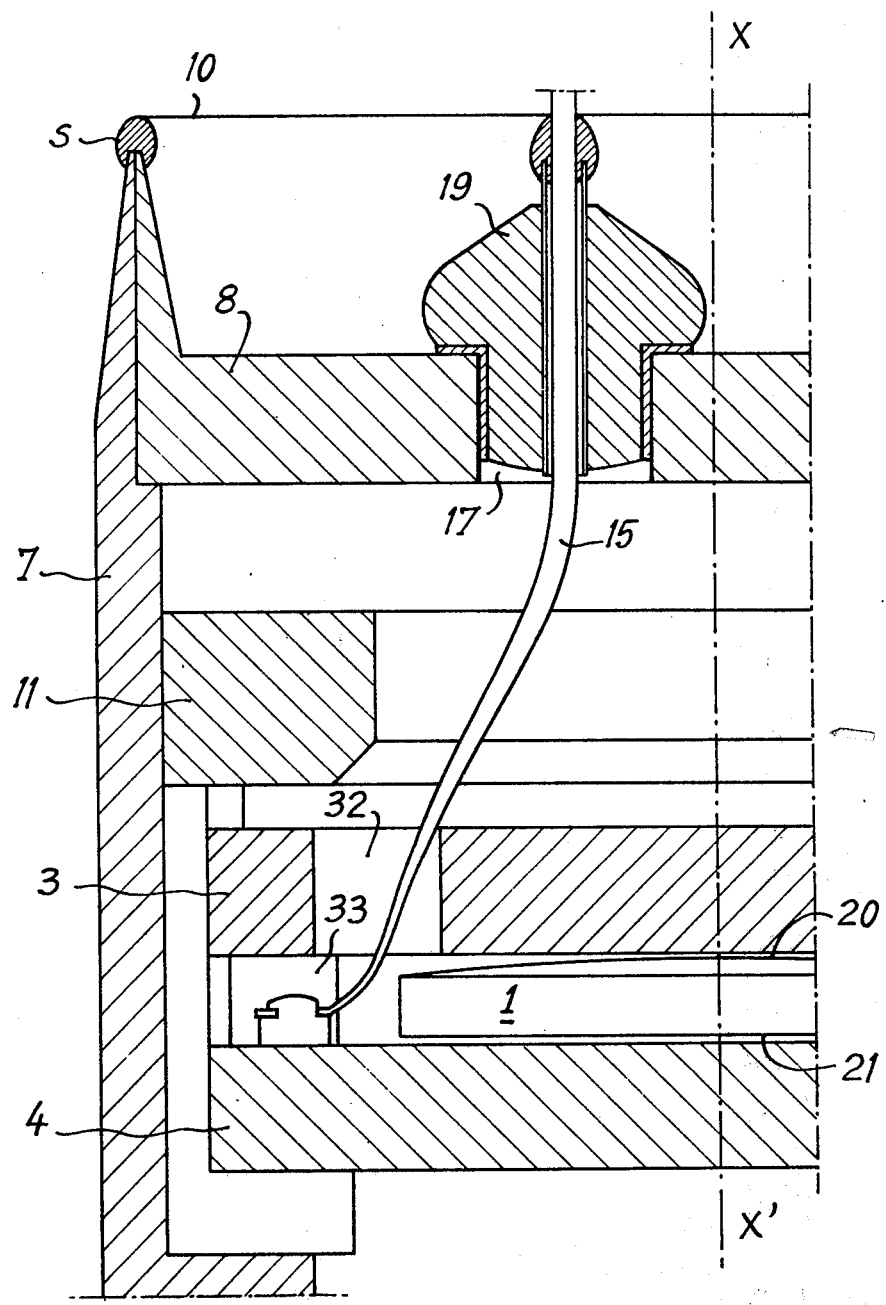
Fig_2

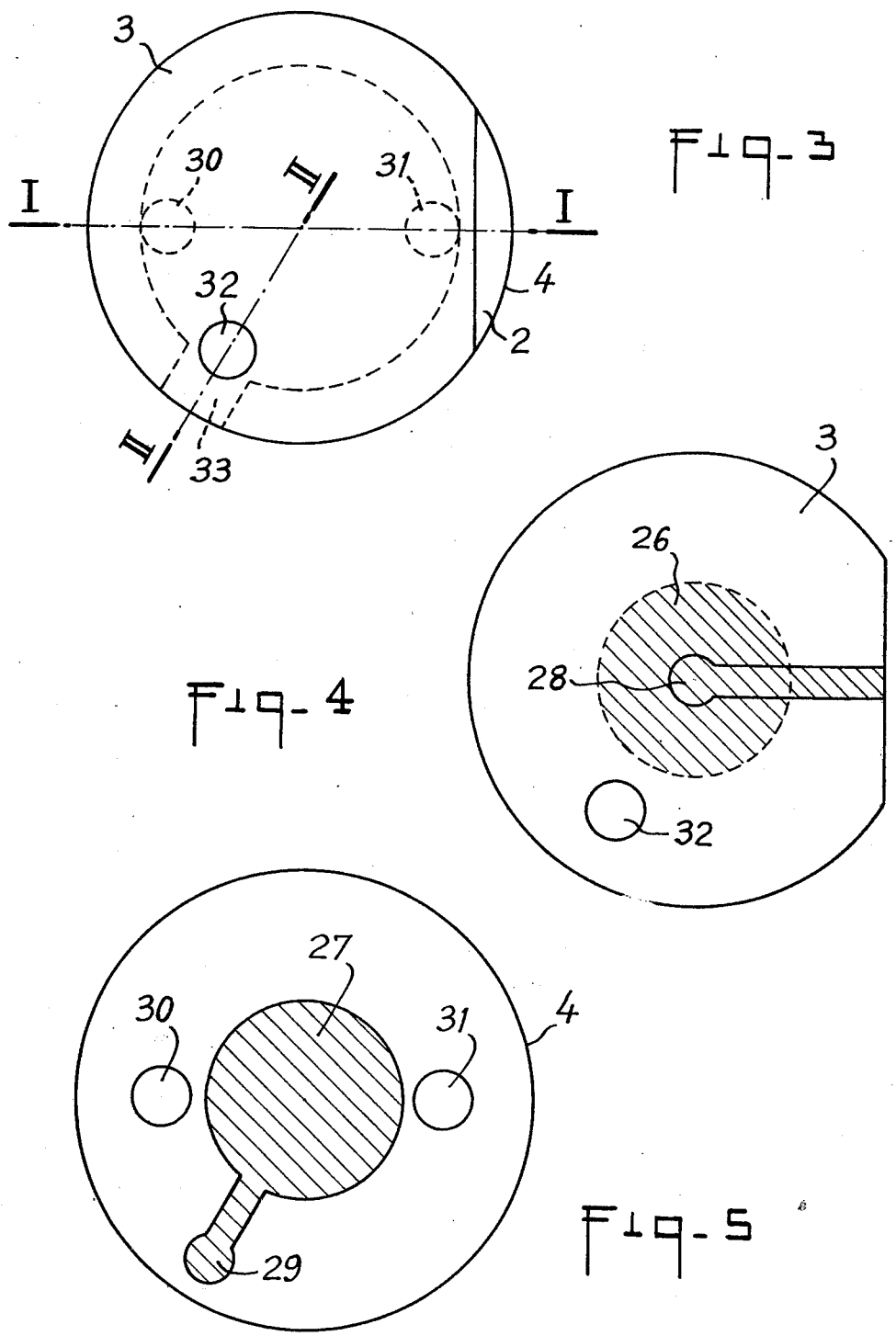

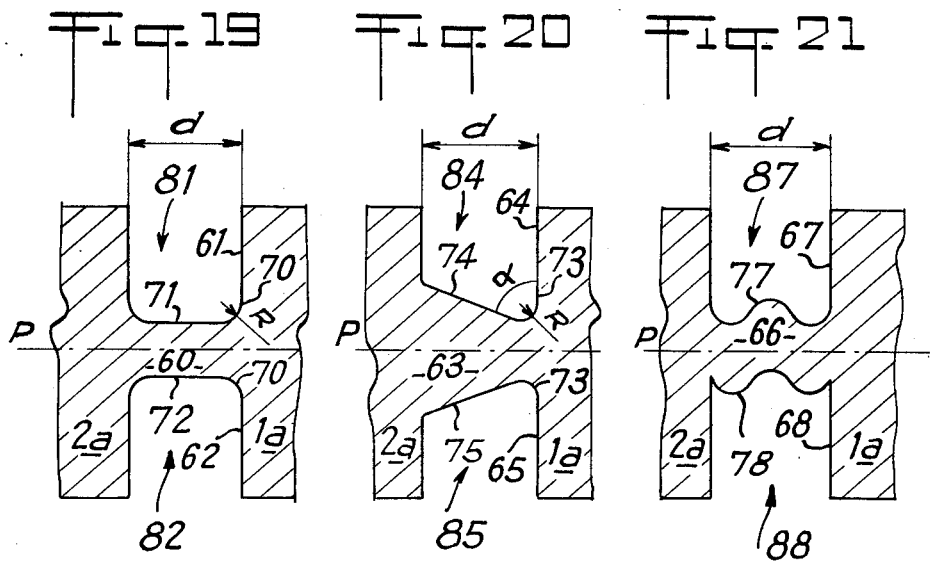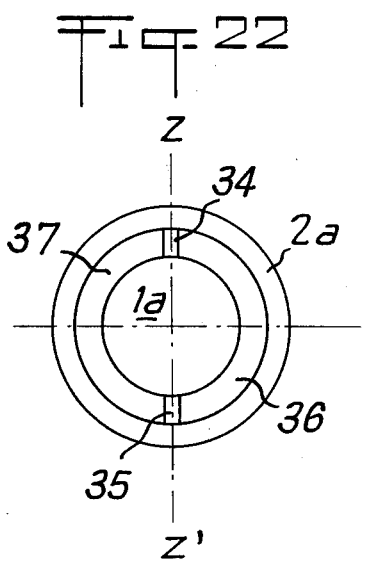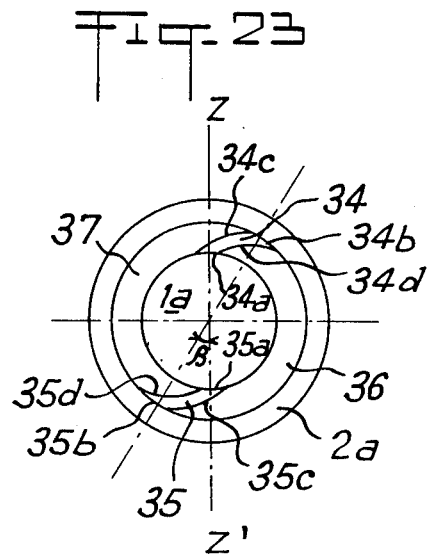

QUARTZ RESONATOR WITH ELECTRODES THAT DO NOT ADHERE TO THE CRYSTAL

The object of the present invention is a piezoelectric resonator, in particular a quartz resonator, with electrodes that do not adhere to the crystal.

The high-performance quartz resonators presently known are practically all of the type with electrodes that adhere to the crystal. In such a type of resonator, the quartz crystals are generally suspended from two or three thin strips of nickel which, incidentally, constitute the connection between the electrodes and the outer contacts to the bulb or metal hood constituting the housing of the resonator. These thin metal strips, whose role is both electrical and mechanical, are bonded to the quartz by cement, theremocompression, welding.

Resonators of the type having electrodes that adhere to the crystal, and provided with volume waves, have an essential limitation which is due to conditions whose limits are imperfect, that is to say mainly to the surface defects which limit the piezoelectric solid and to the suspension of the crystal. While defects created by the attachment of the crystal are, in principle, of limited consequence, since the attachment is voluntarily placed outside of the active portion of the cyrstal, that is to say outside of the zone which corresponds to the part of the quartz pellet comprised between the electrodes and where the energy is trapped, the same cannot be said with respect to the defects created by the depositing of a metal layer on the surface of the crystal, in order to form the electrodes.

As a matter of fact, taking into account the brutal nature of the method employed for the depositing of a metal layer on the crystal, the crystalline pileups close to the surface become unsettled, and even if said surface was perfectly prepared, the crystalline properties in its vicinity are perturbed. Furthermore, the metallization diffuses to a certain depth from the surface. Finally, the defects caused by metallization change with the passage of time, and a slow migration of the atoms produced by the metallization can also be witnessed. In addition, the electrodes cause mechanical stresses which cannot be ignored and which change with the passage of time, thus resulting in a frequency slip.

Thus, the properties of the metallization layer and of the part of the crystal which is close to the surface do not remain constant with the passage of time and variations in frequency are introduced with the passage of time. Now the present applications are very demanding, both with respect to short-term stabilities and with respect to medium-term and long-term stabilities, and the stabilities which are obtained at the present time with quartz oscillators having electrodes that adhere to the crystal, although being interesting, are not yet adequate enough to justify using this type of oscillator satisfactorily in the fields of avionics, telecommunications and radar, for example.

Furthermore, the metal deposited on the crystal, and the crystalline layer which is perturbed by such deposit, result in the quality coefficient of the resonator being decreased.

Moreover, in the main fields of application of resonators, it is desirable to use a resonator having a frequency which is sufficiently close to a "round" value (for example: 5 MHz, 25 MHz, 100 MHz...). It is then advisable, at the time when the resonator is being manufactured, to adjust the frequency in order to bring it to a predetermined value. This constitutes the operation called "placing on frequency". The procedure is at present as follows: the electrodes are first of all metallized on the quartz, the cyrstal is then attached and finally, additional metallization is deposited, generally by evaporation under vacuum, this last-mentioned operation effecting an adjustment of the frequency, which decreases as the mass of metallic deposit increases. This placing on frequency operation is critical because:

an attempt is made to bring the resonator at a given frequency corresponding to its inversion temperature, which is not the temperature of the crystal at the time of placing on frequency (this last-mentioned temperature is, moreover, not well known), it is difficult to control the metal deposit.

For these reasons, it is very difficult to obtain a placing on frequency of better than $\pm 10^{-6}$, or 10 Hz in all for a frequency of 5 MHz. However, at the present time, it would be desirable to be able to effect an even more accurate placing on frequency. In addition to the method of supplementary evaporation of a metal under vacuum, it is possible to effect a placing on frequency by means, for example, of an electrolytic bath or of cathode spraying, the last-mentioned operation being carried out in situ or not. However, these processes do not make it possible either, to obtain placing on frequency of better than $\pm 10^{-6}$. Another placing on frequency techinque consists in causing the frequency of the resonator to increase by evaporating a small amount of the metal of the electrode under the impact of a laser beam (radiation) focused on the electrode. This accurate method can be applied, however, only to unpolished quartz crystals and cannot be used on resonators which are housed in metal hoods. Furthermore, long-term stability is affected by such a treatment, for the atmosphere of the resonator contains the products pulled off the electrode, and the quartz crystal may be damaged in places. It thus appears that all placing on frequency methods must, on account of the structure of resonators with electrodes that adhere to the quartz, operate either in situ, which then affects aging, or under conditions which are difficult to establish with respect to the operating conditions of the resonator, which affects the accuracy of the placing on frequency.

Since the time when W. G. CADY perfected the first quartz resonator, introduced in 1921, systems with electrodes that do not adhere have often been used. However, the results obtained were, at the time, quite poor, compared with those obtained with resonators having adhering electrodes and which are practically exclusively used at the present time.

An embodiment of a resonator with non-adhering electrodes is also described in an article by A. G. SMAGIN, published in the Magazine "PRIBORY TECKNICA EKSPERIMENTA", No. 6, pp. 143 145, of Nov.–Dec. 1974. These resonators with non-adhering electrodes, used for searches at low temperature, employ crystals with no dislocations and have particularly high quality coefficient. It seems, however, that such a result cannot be obtained with the crystals generally available. Furthermore, the resonator described in the aforementioned magazine comprises a quartz lens 1.82 mm thick, supported at four contact surfaces which are approximately spherical, said lens being placed between two flat electrodes 6 mm apart from each other and supported by two dielectric plates which are maintained assembled by a crown which is arranged around said plates. As a result of the relatively sizeable import of the distance between the electrodes, motional resistance is quite substantial, and the capacitance Cg corresponding to the space comprised between the crystal and the electrodes is of the order of a picofarad, which makes an electrical frequency adjustment by means of placing a condenser in series very difficult. Moreover, a resonator with electrodes that do not adhere to the crystal, of the type described above, contrary to known resonators whose electrodes adhere to the crystal, has no convenient means of placing on frequency.

In U.S. Pat. No. 3,339,091, there has also been proposed a quartz resonator, whose electrodes do not adhere to the crystal, and which comprises a quartz enclosure composed of two plates bearing the electrodes and, inside said enclosure, a quartz crystal maintained between the two plates by means of a peripheral annular portion which is connected to the active central portion of the crystal by four bridges which are diametrically opposite each other in pairs and located in two concentric annular grooves. Such an embodiment has the same drawbacks as the resonator described by A. G. SMAGIN to the extent that the electrodes are arranged on the outer faces of the plates so that the space between electrodes is very large. As a result of this, the crystal has too great an impedance, which makes its use in an oscillator difficult, and placing on frequency by the addition of an external capacitance which is variable and low in value, in series with the resonator cannot be contemplated, since the inter-electrodes capacitance Cg of the resonator is, itself, too low. Furthermore, taking into account the magnitude of the distance between each of the electrodes and the active surface of the crystal, placing on frequency by modifying the geometric parameters of the resonator proves especially difficult and not very efficient. In addition, the quartz supporting-plates, which are included in the interelectrode space, also participate in the oscillations of the resonator and introduce a substantial noise level. Finally, a device such as the one described above is particularly sensitive to variations in pressure of the surroundings in which the resonator is placed.

The purpose of the present invention is to remedy the aforementioned drawbacks and, in particular, to obtain a piezoelectric resonator having improved medium-term and long-term stabilities and a very high quality coefficient, as well as an accurate placing on frequency which is easier to effect.

Another purpose of the invention described here is to obtain a quartz resonator that stands up well mechanically and makes possible an external modification of the conventional properties of the resonator, which properties, in the known devices, depend only on the crystalline pellet (orientation, geometric parameters, ...).

These purposes are achieved, in accordance with the invention, by means of a piezoelectric resonator of the type comprising a tight housing in which a vacuum has been created or a residual gas introduced; inside this housing, a first and a second disk or plate of dielectric material, arranged opposite each other and spaced from one another; a piezoelectric crystal arranged between said first and second disk; a first metal electrode that does not adhere to the crystal, obtained by metallization on the face of the first disk, which face is placed opposite the crystal; a second metal electrode, not adhering to the crystal, obtained by metallization on the face of the second disk, which face is placed opposite the crystal; a first conductor connected to the first electrode and extending outside of the housing; a second conductor connected to the second electrode and extending outside of the housing, means to suspend the crystal in order to maintain the active central portion of the crystal which is located opposite said first and second electrode in a predetermined position with respect to at least said first and second disk; means to maintain in position the assembly formed by said first and second disk inside of the housing; and removable bracing means with respect to the first and second disk in order to maintain said disks spaced from each other; said resonator being characterized by the fact that the bracing means are formed by a single ring of dielectric material which surrounds at a distance the active central portion of the crystal, said portion being placed opposite the first and second electrode, and whose height is such that the free spacings arranged between the active central portion of the crystal and the first and second electrode respectively have a thickness of less than a few dozen microns.

Such a structure imparts a high quality coefficient to the resonator, due in particular to the fact that the electrodes do not adhere to the crystal; great stability with the passage of time; and it makes possible very accurate placing on frequency by varying the distance of at least one of the electrodes with respect to the active portion of the crystal. This result is easily obtained by grinding or chemically attacking the dielectric ring which effects the spacing between the two dielectric disks on which the electrodes are deposited, which makes possible placing on frequency whose accuracy is better than $\pm 10^{-7}$. This method of placing on frequency, which was impossible to use with resonators of the prior art on account of their structure, whether their electrodes adhered to the crystal or not, has, in particular, the advantage of being able to be used at ambient temperature, which can be measured accurately. In addition, the presence of a brace in the form of a ring, which determines the spacing between the two disks, offers an accurate means of dimensional modification of the structure of the resonator without touching the active portion of the crystal.

In accordance with the invention, as the height of the spacing ring is such that the free spacings arranged between the active portion of the crystal and the first and second electrode respectively have a thickness of less than a few dozen microns, and preferably even less than one micron, the resonator in accordance with the invention has low motional resistance and a capacitance Cg (corresponding to the space included between the crystal and the electrodes) which is rather strong, and an effective adjustment of the characteristics of the resonator can be made by means of the ring.

The faces of the first and second disk on which the first and second electrode respectively are deposited may be flat or not.

The radius of curvature of a least one of the faces of the first and second disk on which the first and second electrode respectively are deposited may be different from the radius of curvature of the corresponding face of the crystal placed opposite same.

The two disks are advantageously made of silica.

In accordance with a first embodiment of the invention, the disk from which the crystal is suspended is provided with two very faintly conical holes in which there are placed two hollow metal pieces of the same conicity as the holes and having roughnesses on their outer surface, and thin metal strips, fastened to the edge of the crystal, are engaged in the hollow pieces and welded to the latter in such a manner that suspension of the latter with respect to said disk is obtained.

The hollow metal pieces are preferably made of nickel. The thin metal strips, preferably made of nickel, may be fastened to the edge of the crystal by thermocompression, by means of a cement, electrolytic deposit or welding (soldering). The conical holes correspond advantageously to cones the angle of which is close to 1°.

The spacing ring is advantageously made of silica. The ring may also be piezoelectric and provided with electrodes obtained by metallization on each of its frontal faces so that the thickness of the ring may be slightly modulated by the application of an electrical voltage to said electrodes. The thickness of the spacing ring may also be slightly variable by elastic deformation.

In accordance with a special embodiment of the invention, at least the disk from which the quartz crystal is suspended is made of quartz, and the suspension means for the crystal with respect to said disk include several localized thermocompressions made on the faces of the crystal and the support disk located opposite each other.

This embodiment of the suspension of the crystal with respect to a support disk, applicable within the scope of a resonator having an independent spacing ring, is particularly simple to obtain and is very efficient. As a matter of fact, no metal insert or suspension band is required. Furthermore, inasmuch as the disk from which the crystal is suspended is made of quartz, and as it is preferably oriented in the same direction as the crystal, the thermocompressions do not bring about the appearance of inadmissible thermal stresses.

In accordance with another embodiment of the invention, the spacing ring which surrounds at a distance the active central portion of the crystal and which determines the space between the first and second disk, is formed by a peripheral portion of the cyrstal itself, the intermediate portion of the crystal located between said active central portion and said peripheral portion constituting a ring has, at least over part of the distance between the active central portion and the peripheral portion, a thickness which is smaller than the thickness of said central and peripheral portions; said suspension means for the crystal are formed by the intermediate and peripheral portions of said crystal.

In preferred manner, recesses are formed by ultrasonic machining in the thinned-out intermediate portion of the crystal so that the peripheral portion of the crystal be connected to the central portion of the cyrstal by a limited number of bridges formed by the portions of the intermediate section which have not been hollowed-out.

In such an embodiment, in which the crystal is self-suspended, no metal diffusion exists in the crystal. Furthermore, such a structure is particularly advantageous both with respect to the quality coefficient and the aging of the resonator, for on the one hand, the crystal is suspended from a portion which is quite remote from the zone of trapped energy, on the other hand, the attachment of the crystal does not bring about any element which is foreign to the crystal and likely to promote definite aging (metal diffusion, for example). In addition, with such a type of crystal suspension, it is possible to use very thin crystals, of very high frequency, and made by ionic machining, for example.

Furthermore, self-suspension of the crystal removes the need to effect any thermocompressions or attachments whatsoever on the crystal, by gluing, for instance.

The providing of recesses and thining-outs in the intermediate portion of the crystal makes possible mechanical fitting between the peripheral portion of the immobilized crystal, and the active central portion remains free to vibrate. Such a configuration also makes possible excellent impact strength.

Furthermore, in accordance with a special characteristic of the invention, said means of maintaining in position of the assembly formed of said first and second disk inside the housing comprise mechanical clamping members acting on the faces of the first and second disk located opposite the crystal, on peripheral zones, so that the corresponding pressure exerted on the crystal is effected on zones of said peripheral portion of the crystal which are distant from the bridges which connect said central and peripheral portion, respectively.

Thus, the supports may be effected at considerable distance from the suspension points formed by the crystalline bridges present among the recesses. The supports exerted may also be delocalized on the disks, and stresses to which the peripheral portion of the crystal is subjected may also be distributed in such a manner that the stresses to which the active portion of the crystal is subjected be considerably reduced.

The portions of the quartz crystal which are located in the intermediate part may be thinned-out, recessed or cut as desired so as to obtain mechanical fitting for the vibrations of the crystal.

Furthermore, as regards at least one of the said first and second disk, the portion of surface bearing the electrode and located opposite the central and intermediate portions of the crystal is recessed with respect to the peripheral portion of the same surface which is in contact with the peripheral portion of the crystal, and constitutes a recess whose depth is comprised between a few tenths of a micron and a few dozen microns.

In addition, as regards at least one of the faces of the crystal, the portion of surface corresponding to the central and intermediate portions of the crystal is recessed with respect to the portion of the same surface corresponding to the peripheral portion which is in contact with said first and second disk, and constitutes a recess whose depth is comprised between a few tenths of a micron and a few dozen microns.

The above-mentioned arrangements are interesting as regards the placing on frequency operation, which is carried out advantageously by griding at least one of the faces of the crystal, in order to cause the distance between the crystal and a least one of the electrodes to vary. The change in thickness of the quartz crystal may be effected on the peripheral portion only, by grinding the latter. This makes possible a very fine regulation, with a precision of the frequency adjustment of the order of 1 Hz/micron. In such a case, it is, of course, necessary for the ground face of the crystal to be provided with a recess in its central and intermediary portion, respectively. The change in thickness of the quartz crystal may also be effected over an entire face, that is, on the central, intermediate and peripheral portion, respectively, by chemical attack, for instance, or also by grinding. This makes possible a quick rough adjustment, the frequency adjustment being of the order of a few thousand Hz per micron. The placing on frequency can also be effected by acting on at least one of the disks, especially when the latter has a recess in its central portion. Frequency adjustment is effected by grinding the peripheral portion of the disk located opposite the peripheral portion of the crystal. The frequency can also be adjusted by selecting a disk among a set of calibrated disks prepared in advance and provided in their central portion with recesses of different dimensions.

When the piezoelectric resonator with electrodes that do not adhere to the crystal comprises a quartz crystal, which is most often the case, the material to be used for the plate or plates which support the crystal, as well as possibly for the spacing ring forming a brace between the disks when the ring is independent of the crystal, may, in accordance with the invention, also be quartz. In the continuation of the description, reference is had systematically to the case in which the piezoelectric crystal is a quartz crystal, but the invention extends also to resonators in which a suitable piezoelectric material, having equivalent properties, is substituted for quartz.

The electrode-supporting disks or plates may be made in most varied fashion. These plates are preferably made of a dielectric material, such as silica, for example. Within the scope of special applications, all or part of either plate may also be made of a more or less conductive material, so as to form a portion capable of being a heating portion, under the effect of induced currents, for example.

However, in the largest number of applications, it is desirable to reduce thermal stresses in the crystal as much as possible. These stresses are due to expansion coefficients which are different between the crystal and the disks supporting the electrodes and the crystal. By using the same material for the crystal-supporting disk or disks as for the crystal itself, thermal stresses in the crystal are reduced.

In order to decrease thermal stresses even further, it is advantageous for the quartz disk or disks to have the same crystallographic orientation as the quartz crystal arranged between said first and second disk. In other words, it is advantageous, in order to decrease thermal stresses and increase the stability of the resonator, for the angle alpha between the projections of the axes ZZ' of the quartz crystal and a support disk of quartz to be zero. But this condition is not indispensable.

In particular, when the crystal is suspended both from the first and from the second disk, which is the case especially when the crystal is suspended from its peripheral portion, it is advantageous, but not required, for the first and second disk to both be made of a material which is identical to the one of which the crystal is made and, preferably, that they have the same orientation as the crystal which is interposed between them.

In order to increase performance even further, the first and second support disk, as well as the crystal to be interposed between them, can be prepared of one and the same original crystal.

In a quartz resonator with electrodes that do not adhere to the crystal, of the type in accordance with the invention, it is desirable to provide spaces between the electrodes and the crystal which represent an extremely small distance, of the order of one micron to a few dozen microns, or even of a few tenths of a micron to a few microns. As a matter of fact, the overvoltage coefficient is thus increased, while motional resistance is decreased. In the case of a crystal which is suspended between the first and second disk from its peripheral portion, it is especially desirable to provide, in the central portion of the electrode-bearing silica disks, a recess of the order of one micron to a few dozen microns, thus making it possible for the electrode which has been deposited by metallization in the recess of the disk, to be itself recessed at this distance from the crystal. It may be convenient to provide such a recess either parallel to the surface of the disk, or by grinding the surface of the disk by means of two radii of curvature which are different for the central portion and the peripheral portion, respectively. In such case, the radius of curvature of the peripheral portion of the disk is equal to that of the surface of the quartz crystal located opposite to it, while the radius of curvature of the central portion of the disk is smaller.

In accordance with the invention, a very small space between electrode and crystal can easily be provided and with great precision without it being necessary to grind the surface of the disk on which the electrode is deposited, in order to create a recess. This is made possible by the fact that, in accordance with a characteristic of the invention, the face of at least one disk turned towards the crystal receives, over at least a part of its periphery, located opposite to the peripheral portion of the crystal, a thin metal layer, followed by a thin layer of nickel.

The thin layer of metal may be deposited by evaporation on the corresponding disk, while the thin layer of nickel may be deposited by electrolysis on said thin layer of metal.

It should be noted that the presence of such a coating on the periphery of the faces of one or of both disks located opposite to the peripheral portion of the crystal makes possible the convenient providing of a very small space between electrode and crystal, without any other mechanical or chemical treatment of the surface of the crystal or of the disks, while at the same time playing the role of absorber of possible impacts.

In accordance with a further characteristic of the invention, residual stresses at the points of suspension of the crystal can be eliminated and the quality coefficient as well as stability with the passage of time can be considerably increased if the quartz crystal is subjected, prior to mounting, to an annealing operation effected at a temperature which is definitely lower than the alpha-beta transformation point of the quartz (573° C.), about 480° C., for example, this being followed by a very slight surface attack with bifluoride.

Other characteristics and advantages of the invention will become more evident upon reading the following description of several embodiments of the invention, given solely by way of illustration and not of limitation, with reference to the attached drawings, in which:

FIG. 2 is a view, in partial section, of the quartz resonator of FIG. 1, according to plane II—II of FIG. 3;

FIG. 3 is a top view of a part of the quartz resonator shown in FIGS. 1 and 2;

FIGS. 4 and 5 are top views of two dielectric electrode-bearing disks incorporated in the assembly shown in FIGS. 1 to 3;

FIGS. 19 to 21 represent sections, within a plane containing the axis of the section, of several embodiments of bridges which can connect the peripheral and central portion of a quartz crystal which can be used in a resonator in accordance with the invention; and FIGS. 22 and 23 are top views of two quartz crystals which can be incorporated in a quartz resonator in accordance with the invention.

Figure 1:
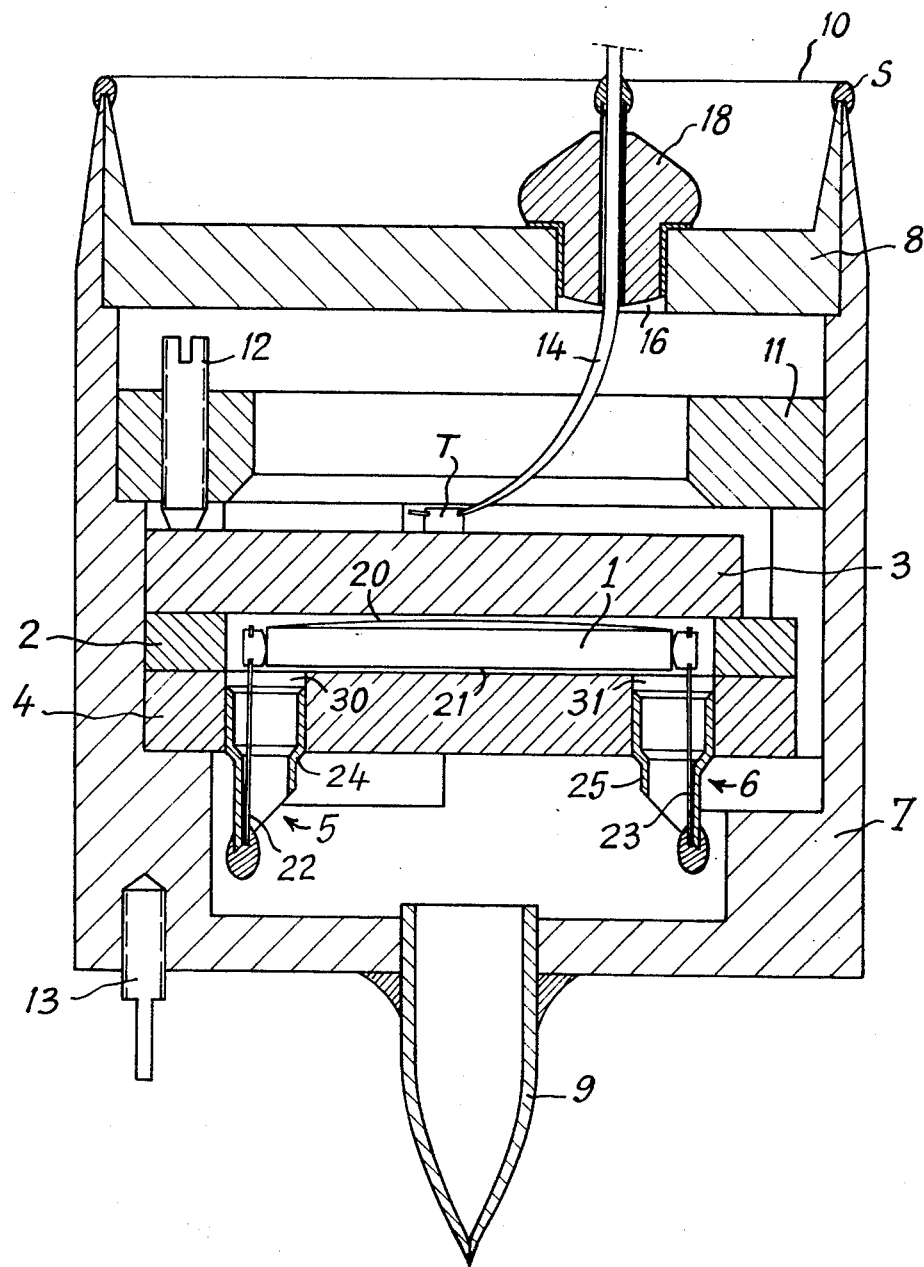
FIG. 1 is a sectional view of a quartz resonator, in accordance with a first embodiment of the invention, along plane I—I of FIG. 3.

The quartz resonator shown in FIG. 1 comprises a quartz crystal 1 enclosed in a condenser obtained by means of two dielectric disks 3 and 4 bearing electrodes and separated by a dielectric ring 2. The crystal 1 is held in fixed position with respect to the lower disk 4 by suspension means 5, 6. The disks 3 and 4, as well as the ring 2, are made of silica, for example.

The assembly formed of the dielectric disks 3, 4, the ring 2 and the crystal 1 is mounted in a housing formed of a body 7 and a cover 8. The metal housing 7, 8, made, for instance, of gilded nickel brass, and closed by cold-welding, is shaped in such a manner that degasification be minimal and that a sustained vacuum or residual atmosphere be maintained (hydrogen, helium, nitrogen ... ). On the assembly shown in FIG. 1, the cold-weld closing is effected at the level of the tube 9, while the cover 8 is welded to the housing by a weld bead 10 S. The housing 7,8 could, of course, be closed by cold-welding at the level of the cover, with the result that, in addition to the disappearance of the welds 10 on the housing, the tube 9 would also disappear and the overall length of the resonator would be reduced.

The lower disk 4, which is topped by the ring 2 and the upper disk 3, rests on a shouldering formed in the wall of the housing 7. A metal ring 11 is embedded in the housing 7 above the upper disk 3. The ring 11, by means of screws 12, and possibly via springs, not shown, effects the mechanical locking of the silica condenser formed by parts 2, 3, 4. The screws 12 can, for instance, be three in number, be arranged 120° from each other, and rest against the periphery of the disk 3 at the level of the portion capping the ring 2.

A ground terminal 13 is fastened to the housing 7. Outgoing wires 14, 15, connected, for example, by thermocompression T, preceded by a gold deposit on the electrodes formed on the disks 3, 4, respectively, debouch outside of the cover 8 via orifices 16, 17, respectively, provided with insulators 18, 19 (FIGS. 1 and 2).

The crystal 1 may have various shapes which depend on the applications contemplated. Thus, crystals which are plane convex, biconvex, biplane ... may be used. FIG. 1 shows, as example, a circular plane convex crystal having a plane lower face 21 and a convex upper face 20.

The surface of the crystal 1 must be prepared carefully and have as few defects as possible. In order for the properties of the portions of the crystal close to the surface to be as similar as possible to the properties of the inner crystal, alternate methods of shaping the surface geometrically (grinding, polishing) and of cleaning it and attacking it chemically are used. In conventional manner, the above-mentioned operations of shaping the surface, cleaning same and attacking it chemically, are carried out at one and the same time. Finally, the crystal 1, in accordance with often used methods, is carefully rinsed and cleaned with solvents such as distilled water, pure acetone, or pure alcohol.

In accordance with a first form of suspension of the crystal 1 in the silica condenser 2, 3, 4, gold or silver rivets are thermocompressed on the edge of the crystal 1 at least at two diametrically opposite points on the axis ZZ'. These rivets are riveted on thin metal strips of preferably annealed metal 22, 23 which shall be fastened to supports 24, 25 mounted in the lower disk 4. These thin strips 22, 23, made, for example, of nickel or even of brass, can, of course, also be cemented on the edge of the crystal. However, thermocompression is preferable in order to avoid any degasification resulting from the use of cements. In the place and stead of thermocompression, a method of electrolytic deposit welding with nickel (nickel electrodbonding) could, for example, be used.

Two holes 30, 31, diametrically opposite one another, are drilled into the lower disk 4 (FIGS. 1 and 3). These holes 30, 31 are slightly conical, the angle of the corresponding cone being preferably less than, or equal to 1°. Two hollow metal pieces 24 and 25, slightly conical, and having the same angle as that of holes 30 and 31, are engaged in the holes 30 and 31, respectively. The hollow pieces 24, 25 are preferably made of nickel, and their outer surface has roughnesses. A state of unevenness of surface may be obtained by sanding, for instance. The hollow pieces 24 and 25, which may furthermore be cooled prior to mounting, if necessary, are attached in reliable fashion to the lower disk 4. The hollow pieces 24, 25 may be provided with a bore of larger diameter in the upper portion than in the lower portion.

The crystal 1, provided with its two strips of nickel 22, 23, is installed between the two disks 3 and 4, so that a small spacing of the order of 20 microns, determined, for example, by the interpositioning of thin gold sheets, be arranged between the upper face of the disk 4 and the lower face 21 of the crystal 1. The small strips of nickel 22, 23, after having been tinned first of all, are welded to the supports 24, 25, respectively, they too, having been tinned previously. A tin welding S, which degasses very little under vacuum, is preferably selected. Methods of welding where melting takes place at higher temperature may also be used. The means 5, 6 for suspension of the crystal, which comprise the hollow pieces 24, 25 and the thin strips of nickel 22, 23, provide the maintaining in position of the crystal 1 with respect to the disk 4. More than two suspension means 5, 6 may, of course, be provided, three or four suspension means, for example, connected to three or four points selected on the periphery of crystal 1.

As already stated, the condenser in which the cyrstal 1 is enclosed is made up of two silica disks 3 and 4 separated by a ring 2. The upper disk 3 is ground flat, but it is also possible to grind its central portion to the same radium as that of the upper face 20 of crystal 1. The upper disk 3 is held at a small distance from the upper face 20 of crystal 1 (distance comprised between about 10 and 100 microns) by means of the ring 2 which determines the spacing between the two disks 3 and 4.

It is to be noted that it is not necessary that the flat face 21 of the crystal be parallel to the faces of the silica disks 3 and 4. Furthermore, a slight vertical shift of crystal 1 (caused, for instance, by expansion of the suspension 5, 6) would not matter, as the spacing between the two disks 3 and 4 remains determined solely by ring 2.

The electrodes 26 and 27 of the condenser surrounding crystal 1 are shown hatched in FIGS. 4 and 5, respectively. The electrode 26 is provided on the lower face of the upper disk 3, while the electrode 27 is provided on the upper face of the lower disk 4. The electrodes 26 and 27 are deposited by evaporation under vacuum and could have configurations other than those shown in FIGS. 4 and 5. The portion of crystal 1 included between the two electrodes 26 and 27 constitutes the active portion of the crystal. The electrodes 26 and 27, which are located in the central portion of the disks 3 and 4, have extensions to resting areas 28 and 29 located on the upper faces of disks 3 and 4 and on which the connections of the outgoing wires 14 and 15, respectively, are established (FIGS. 1 and 2). The outgoing wire 15, connected to the area 29 of the electrode 27 by thermocompression, for example, passes through an opening 33 provided in the ring 2, and through a hole 32 provided in the upper disk 3 and emerges from the housing 8 via the orifice 17. In order to reduce parasitic capacitances between the housing and the electrodes, the upper disk 3 bearing the electrode 26 is notched in the portion bearing the connection channel between the electrode 26 and the area 29.

The ring 2 is the only member which determines the spacing between the disks 3 and 4. This ring 2 may be made of silica, but it may also be made of a material whose thickness may vary by elastic deformation.

The ring 2 may also be piezoelectric and be of slightly variable thickness if an electrical voltage is applied between two electrodes previously deposited on the upper and lower face of the ring. The presence of a piezoelectric ring 2 provides the means of modulating the frequency of the resonator without introduction of a component part outside the resonator, such as an auxiliary condenser, whose quality coefficient is always relatively low.

Thus, the thickness and the material of ring 2 which determines the spacing of the armatures of the condenser constitute additional parameters of the resonator which permit a modification of the properties of the resonator without the structure of the active portion of the quartz crystal 1 being modified.

The presence of a ring 2 which is removable and made in a single piece is, furthermore, particularly advantageous, for it makes accurate and easier placing on frequency possible. Placing on frequency can be effected at ambient temperature Ta (which can be measured accurately) and at atmospheric pressure when the resonator is placed in its silica condenser. In order to adjust the frequency of the resonator, it is sufficient to remove the condenser formed by pieces 2, 3 and 4 and to touch up the ring by grinding, or thinning by chemical attack. A ring may also be selected from a calibrated lot which has been prepared in advance. A decrease of one micron in the thickness of the ring corresponds to a descrease in frequency of approximately 1 Hz (for a resonator with a frequency of 5 MHz operating on partial mode 5), which permits very precise adjustments. In practice, the inversion temperature TI is first of all measured (as well as the corresponding frequency difference$\Delta f$) and, by means of a small testing enclosure under vacuum, any possible change in frequency when passing from atmospheric pressure to vacuum is also measured. Once the difference in frequency between the adjustment conditions and the actual operating conditions has been determined, adjustment of the frequency of the resonator can then be effected with great precision by adjusting the thickness of the ring at an ambient temperature $T_a$, and under atmospheric pressure. Accuracy of better than $\pm 10^{-7}$ can thus be obtained.

Figure 11:
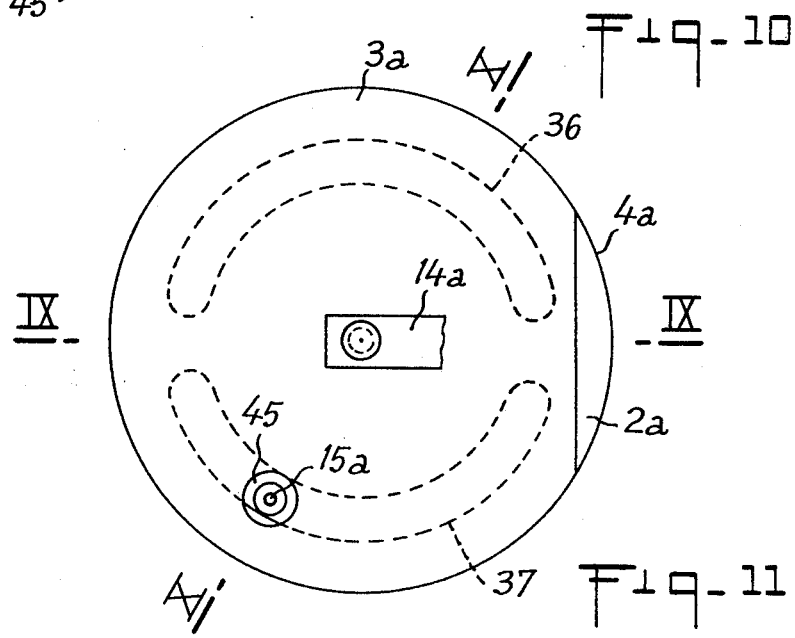
FIG. 11 is a top view of the part of the resonator shown in FIGS. 9 and 10.
Figure 12:
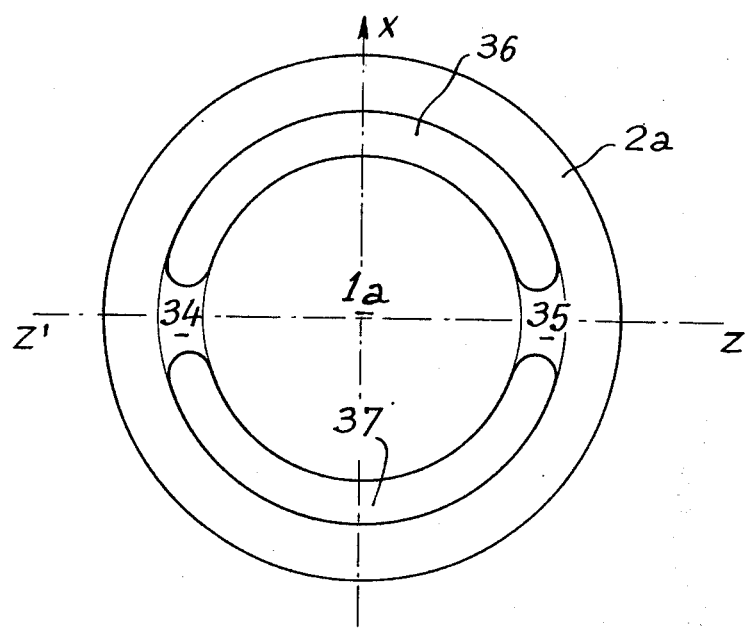
FIGS. 12 and 13 are top views of two quartz crystals which can be incorporated in the quartz resonator shown in FIGS. 9 to 11.

It should be noted that the curves showing the variations in frequency of a resonator in accordance with the invention, as a function of the temperature, are almost identical with the wellknown curves obtained for a conventional resonator with electrodes that adhere to the crystal. One example of such curves referring to sections AT is shown in FIG. 11.

Figure 6:
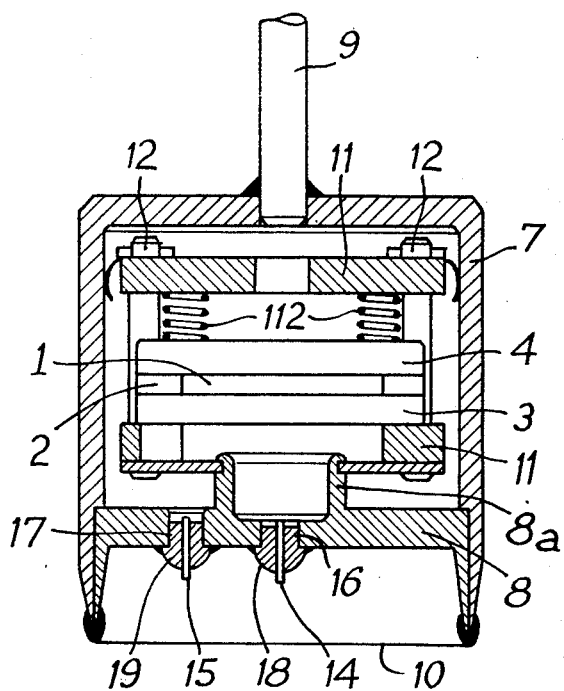
FIG. 6 is a diagrammatic view in axial section, of another resonator embodiment in accordance with the invention and having good impact strength.

FIG. 6 shows a variant of the resonator in FIGS. 1 and 2, it having a configuration which makes it particularly impact-resistant. The members of the resonator in FIG. 6 are similar to the members of the resonator shown in FIGS. 1 and 2 and having the same reference numbers. A metal housing 7, provided with a cover 8 welded to the housing body 7 by a weld-bead 10 is closed by cold-welding at the level of the tube 9. The housing 7, 8 thus forms a tight enclosure in which it is possible to obtain a more or less deep vacuum, or to introduce a residual gas. The housing 7 has a cylindrical shape which is especially simple to machine and which corresponds to the shape of the active members of the resonator, but it could, of course, have other geometrical shapes.

The two disks or plates 3 and 4 which support the electrodes, the quartz crystal 1 which is interposed between the plates 3 and 4, and the ring 2 forming a brace between the disks 3 and 4 are arranged inside the tight enclosure 7, 8. The members 1, 2, 3 and 4 are shown diagrammatically in FIG. 6 and have a configuration which may be in accordance with the previously described embodiments. Plates 3 and 4 and ring 2 may be given a circular shape with a symmetry of revolution about the longitudinal axis of the resonator. Support plates 3 and 4 in the form of disks and a ring 2 of annular form are, as a matter of fact, particularly easy to make and limit defects that might surface with parts that are very asymetrical. However, proper operation of the resonator may be obtained with disks 3 and 4, as well as with a ring 2, whose peripheral portions may have very different geometrical shapes.

In order to increase impact-resistance, mechanical blocking of the condenser formed by parts 2, 3 and 4 is obtained exclusively by springs 112. Two parts 11, rigidly connected to each other and maintained at a distance from each other by connecting members 12, are fastened to a protruding portion 8a of the cover 8. The assembly formed by parts 2, 3, 4 is held in position between the plates 11 by the springs 112 which are interposed between one of the disks 3, 4 and the corresponding plate. The supporting means for the crystal 1 inside the condenser 3, 4 are not shown in FIG. 6.

Two outgoing conducting wires 14 and 15 emerge from the cover 8 through orifices 16 and 17 filled with an insulating material 18, 19, respectively. The wires 14 and 15 are connected to the electrodes, not shown, which have been deposited on the disks 3 and 4, respectively.

The spacing ring 2 between the disks 3 and 4 is advantageously made of silica. The ring 2 may also be made of quartz. However, in the event that frequency modulation of the resonator is contemplated by means of an action on the ring 2, it is desirable to use a ring 2 made of a piezoelectrical material of great coupling capacity, such as a piezoelectrical ceramic material, for example.

The disks 3 and 4 are preferably made of a dielectrical material, such as silica, for instance. However, in this last-mentioned case, certain thermal stresses appear in the cyrstal 1, they being due to different expansion coefficients between the crystal 1 and the support plates 3 and 4. This is why the resonator of FIG. 6 has improved characteristics when the disks 3 and 4 are made of quartz. Although poor orientation is possible, that is to say, the existence of a certain angle which is not zero between the cristallographic orientation of crystal 1 and the orientation of the quartz disks 3 and 4, it is advisable that each quartz disk have the same orientation as the quartz crystal.

In the event that the disks 3 and 4 are maintained spaced by a ring 2 which is independent of the crystal 1, and that the crystal 1 is suspended from a single disk, disk 4, for example, (FIGS. 7 and 8), it may be sufficient for only the disk 4 from which the crystal 1 is suspended to be made of quartz.

Figure 7:
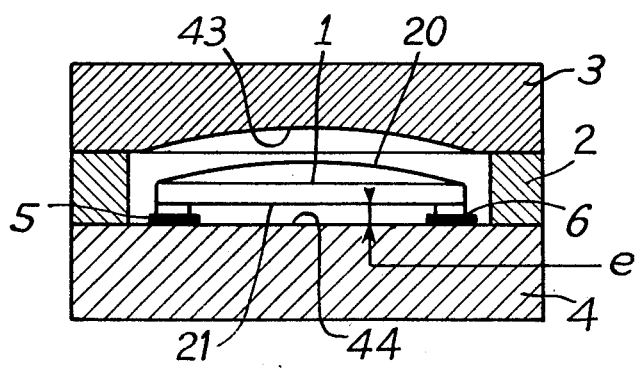
FIGS. 7 and 8 are views, in axial section, of a part of the resonator in accordance with the invention, pursuant to two different variants.
Figure 8:
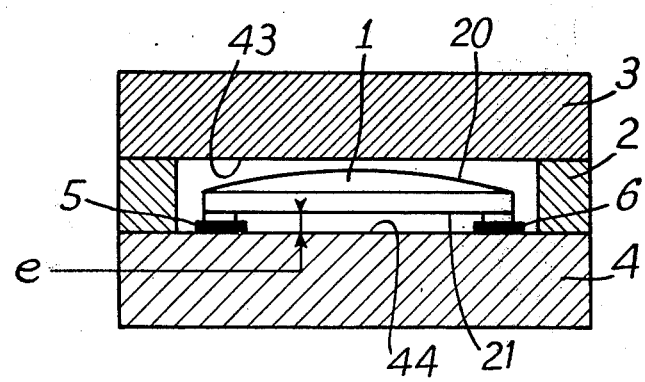
Figure 9:
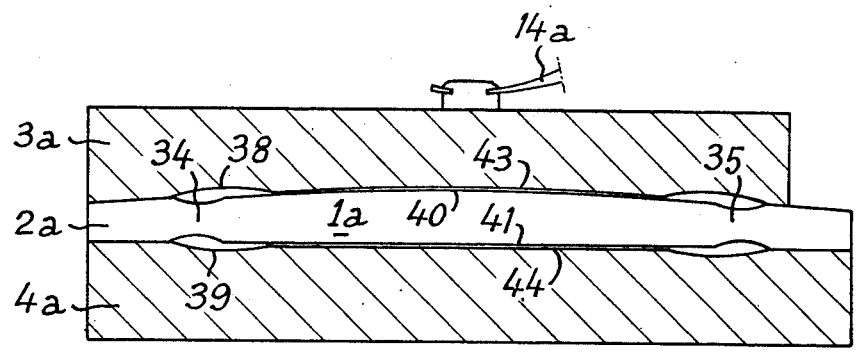
FIGS. 9 and 10 are sectional views of a part of a quartz resonator, in accordance with another embodiment of the invention, along plans IX—IX and X—X, respectively, of FIG. 11.
Figure 10:
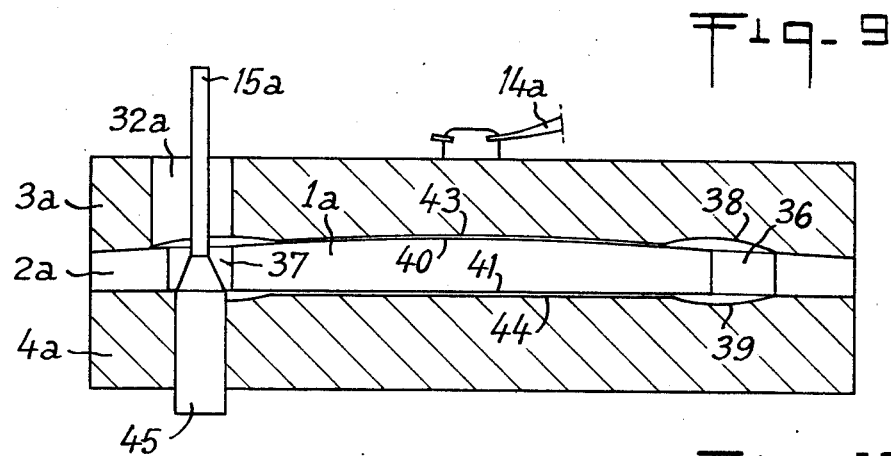

FIGS. 7 and 8 show two variant embodiments of an assembly comprising a condenser 3, 4, a ring 2 and a crystal 1, said assembly being intended to be mounted in a resonator such as the one shown in FIG. 6. The crystal 1 is interposed between two disks 3 and 4. The two disks 3 and 4 are maintained spaced from one another by an independent ring 2. The lower disk 4 from which the crystal 1 is suspended is made of quartz having the same orientation as the crystal 1. The crystal 1, housed in the cavity delimited by the ring 2 and the disks 3 and 4, is connected to the disk 4 by thermocompression at several points, said thermocompression being effected on metal deposits 5, 6 of gold or silver, previously made on the crystal 1 and on the corresponding portions of the lower support 4. The thermocompressions are effected on the circumference of the face 21 of the crystal 1 located opposite to the FIG. 44 of disk 4. The electrode, not shown, which is associated with the disk 4, is deposited on the face 44 at a distance from the thermocompressions 5, 6 and opposite to the central portion of the face 21 of the crystal 1. The distance e between, on the one hand, the electrode deposited on the face 44 of the disk 4 and, on the other hand, the face 21 of the disk 1 depends merely on the thickness of the thermocompressions 5, 6 and may be comprised between about 0.5 $\mu$ and 50 $\mu$. If the thickness e is relatively large (10–50 $\mu$), it is possible to introduce a small, thin additional gold plate between the two gold deposits effected under vacuum, before effecting the thermocompressions 5, 6. It should be noted that the type of suspension of crystal 1 shown in FIGS. 2 and 3 requires no drilling of disk 4, nor the use of any metal insert or metal strip for purposes of suspension. Furthermore, due to the fact that crystal 1 and disk 4 are both made of quartz having the same orientation, no excessive thermal stresses appear in the crystal at the level of the suspension zones.

The face 43 of the disk 3 located opposite the upper face 20 of crystal 1 may be flat (FIG. 8), or have a radius of curvature close to that of the upper face 20 of the crystal (FIG. 7).

With the exception of the type of attachment of crystal 1 by means of direct thermocompression on the quartz disk 4, all of the parts shown in FIGS. 7 and 8 may be made in the manner described above with reference to FIGS. 3 to 5.

Another embodiment of a resonator in accordance with the invention is shown in FIGS. 9 to 13. Pursuant to this embodiment of the invention, in a housing 7, 8 which is identical to the one shown in FIGS. 1 or 6, an assembly formed by two disks 3a and 4a bearing electrodes, similar to the disks 3 and 4 of FIGS. 1 to 8, and a crystal 1a, 2a interposed between the two disks 3a and 4a, and equivalent with the crystal 1 and the ring 2 of FIGS. 1 to 8, is substituted for the assembly formed by the electrode-bearing disks 3 and 4, the ring 2, the crystal 1 and the means 5 and 6 for the suspension of the crystal. In this embodiment, the member 2a which forms the spacing ring between the disks 3a and 4a is formed by a peripheral portion of the crystal itself, and connected via intermediate portions 34, 35 to a central portion 1a of the crystal which is equivalent with the crystal 1 of FIGS. 1 to 8. Thus, the crystal is self-suspended, as no foreign member connects it to the support disks 3a and 4a.

The crystal used may, as in the first examples of embodiment of the invention, assume various shapes. The crystal shown in FIGS. 9 to 13 is plane convex, its flat face being its lower face. The crystal 1a, 2a is prepared in the manner described above for crystal 1. As can be seen in particular in FIG. 9, the crystal has a narrow part 34, 35 in its intermediate portion located between its active central portion 1a and its peripheral portion 2a forming the spacing ring. The narrow part 34, 35, obtained by grinding, may be circular, but it could have other configurations, depending, in particular, on the configuration of the electrodes. Following a rough placing on frequency, recesses 36, 37 (FIGS. 10 to 12) are provided, by ultrasonic machining, for instance, in a portion of the narrowed annular part separating the central portion 1a and the peripheral portion 2a of the crystal. The crystal is thus suspended from two crystalline bridges 34, 35 connecting the portion 1a to the portion 2a. The crystal may, however, have more than two bridges 34, 35. Thus, in FIG. 13, a crystal is shown, comprising three hollowed-out portions 36a, 36b and 37, and three crystalline bridges 34, 35 and 42. In fact, the intermediate portion between the central portion 1a and the peripheral portion 2a of the crystal, which comprises at least one thinned-out portion, may have bridges in various numbers, depending on the mechanical fitting desired.

The crystal is held between the two armatures 3a and 4a by its peripheral portion 2a, which determines the distance between the disks 3a and 4a. The members 11, 12 (see FIG. 1) which hold the disks 3a and 4a in position, exert an action, preferably in zones of the periphery of the disk 3a which correspond to remote zones of the crystalline bridges 34, 35 of the portion 2a of the crystal.

The geometrical shapes of the silica disks 3a and 4a are obtained by grinding and chemical attack of the silica. The faces of the disks 3a and 4a may be flat.

However, the faces 43, 44 of the disks 3a and 4a have a shape which, advantageously, corresponds to the opposite faces 40 and 41 of the crystal. Grooves 38 and 39 the depth of which is greater than the thickness of the free spacings included between the central portion 1a and each of the electrodes deposited on the faces 43 and 44, respectively, are advantageously formed in the portions of the faces 43 and 44 of the disks 3a and 4a opposite the intermediate portion 34, 35, 36, 37 of the crystal. The faces 43 and 44 of the disks 3a and 4a, whose peripheral portion is intended to follow the shape of the peripheral part 2a of the crystal, have their electrode-bearing central portion recessed with respect to the surface of the crystal 40, 41, respectively, which correspond to it, so that the spacing between the crystal and each of the electrodes be very small (from a few tenths of a micron to a few dozen microns).

Exact placing on frequency of the resonator is obtained by fine grinding of the flat face of the crystal 1a, 2a, followed by chemical attack by means, for example, of a very dilute bifluoride solution. In accordance with an advantageous embodiment, the central portion 1a of the lower face 41 of the crystal is recessed with respect to the peripheral portion 2a of the same lower face 41 of the crystal. The depth of the recess must remain small, of the order of 10 to 20 microns. This embodiment makes it possible to grind, at the time of placing on frequency, only the portion 2a of the surface 41, in a manner similar to the grinding of ring 2 in FIGS. 1 to 3. Very great precision is thus obtained in the adjustment of the frequency. In addition, placing on frequency may also be effected by acting on one of the disks 3a and 4a. On its face 44, the disk 3a, for example, may have a recess of small depth in its central portion (see FIGS. 9 and 10) and be ground on the peripheral portion of said face 44 located opposite the peripheral portion 2a of the crystal in order to obtain precise adjustment of the frequency, by varying the distance between the electrode 27 borne by the face 44 of the disk 3a and the face 41 of crystal 1a. To effect the placing on frequency, it is also possible to select a disk 3a among a set of calibrated disks prepared in advance and each of them being provided, in the central portion of their face 44, with a recess of well-determined dimension.

The electrodes are formed of a gold film which has been evaporated under vacuum on the disks 3a and 4a, as in the first embodiment of the invention. The electrodes are connected to the outgoing wires via thermocompressions T, for example. However, in accordance with a variant, the lower electrode is in contact with a hollow nickel terminal 45 the lower end of which, of conical shape, is adjusted in the cold in a conical hole in the lower disk 4a, in a manner similar to the fastening of parts 24, 25 of FIG. 1. This nickel terminal 45 is spot-welded to the corresponding outgoing wire 15a.

Figure 14:
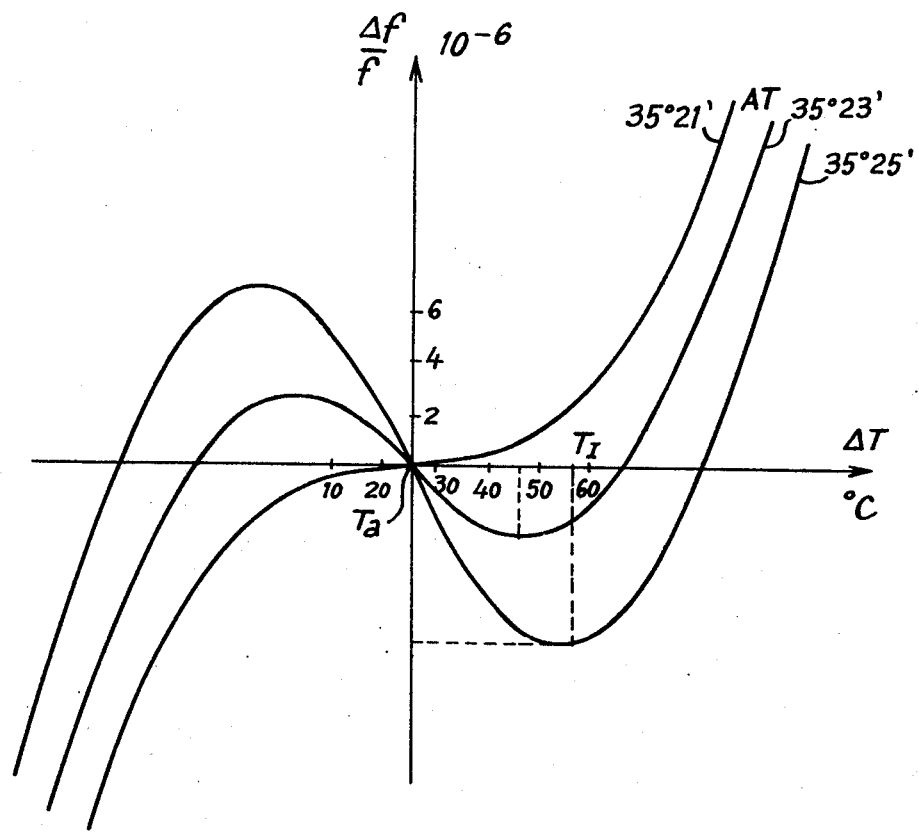
FIG. 14 shows, by way of example, the curves representing the variation in frequency of a resonator in accordance with the invention, as a function of the temperature, for crystals of AT cross-section.

FIG. 14 shows, in the form of examples, three curves giving the frequency spread of the resonator as a function of its operating temperature, as compared with operation at a temperature of reference Ta, corresponding to the ambient temperature. The three curves correspond to quartz crystals of section AT having different cutting angles.

Figure 15:
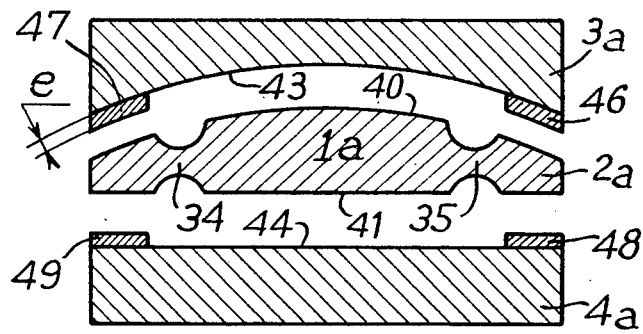
FIG. 15 is an elevation with exploded view of a part of a quartz resonator in accordance with a variant of the invention.

FIG. 15 shows an assembly of parts 1a, 2a, 3a and 4a which are equivalent to the assemblies shown in FIGS. 2 and 3, but in which the spacing ring 2a is formed by a peripheral portion of the crystal itself, and connected via a continuous or discontinuous intermediate portion 34, 35 to an active central portion 1a of the crystal. The distance between the electrode deposited on one of the disks and the corresponding face of the crystal 1 must be very small and be comprised, preferably, between one micron or a few tenths of a micron and a few dozen microns. The value of the quality coefficient of the resonator is, as a matter of fact, increased and the motional resistance decreased, when the distance between electrode and crystal decreases, without the electrode adhering to the crystal, however. It is possible to provide, in the central portion of the disks 3 and 4 which are made of silica or quartz, for example, a recess of small thickness making it possible for the electrode to be recessed by said distance from the crystal. Such a recess can, furthermore, be provided either parallel to the surface of the quartz crystal, or by effecting two grindings having different radii of curvature on the face of a disk 3 or 4 and the corresponding face of crystal 1. Another solution which can be used to determine conveniently a space between electrode and crystal of small value consists, as shown in FIG. 15, in depositing on disk 3a and disk 4a, a thin layer of nickel 46, 47 and 48, 49, respectively, by electrolysis, over a thin metal layer previously evaporated on the periphery of the faces 43 and 44 of disks 3a and 4a or over one or several portions of said periphery located opposite the peripheral portion 2a of the crystal. The layer of nickel 46, 47, deposited on the face 43 of the disk 3a, and the layer of nickel 48, 49, deposited on the face 44 of the disk 3a determine spacings e between the electrode deposited on the face 43 of disk 3a and the face 40 of the crystal, or between the electrode arranged on the face 44 of disk 4a and the face 41 of the crystal, which spacings e may be very small, of the order of 0.5 to 50 $\mu$, for example. The electrodes are not shown in FIGS. 15 and 16.

Figure 16:
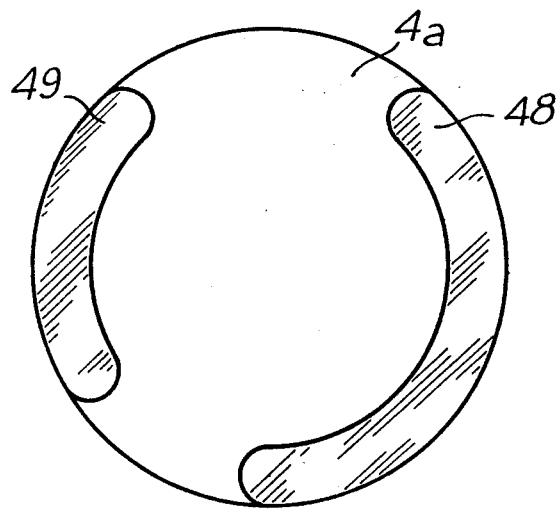
FIG. 16 is a top view of one of the parts shown in FIG. 15.

The layer of nickel 46, 47, 48, 49 acts as damper against possible impacts, and makes unnecessary any additional grinding or chemical attack of the faces 43 and 44 of the disks 3a and 4a. The layer of nickel need, as can be seen in FIG. 16 as concerns the disk 4, cover only one or several portions 48, 49 of the periphery of the face of the corresponding disk.

Figure 17:
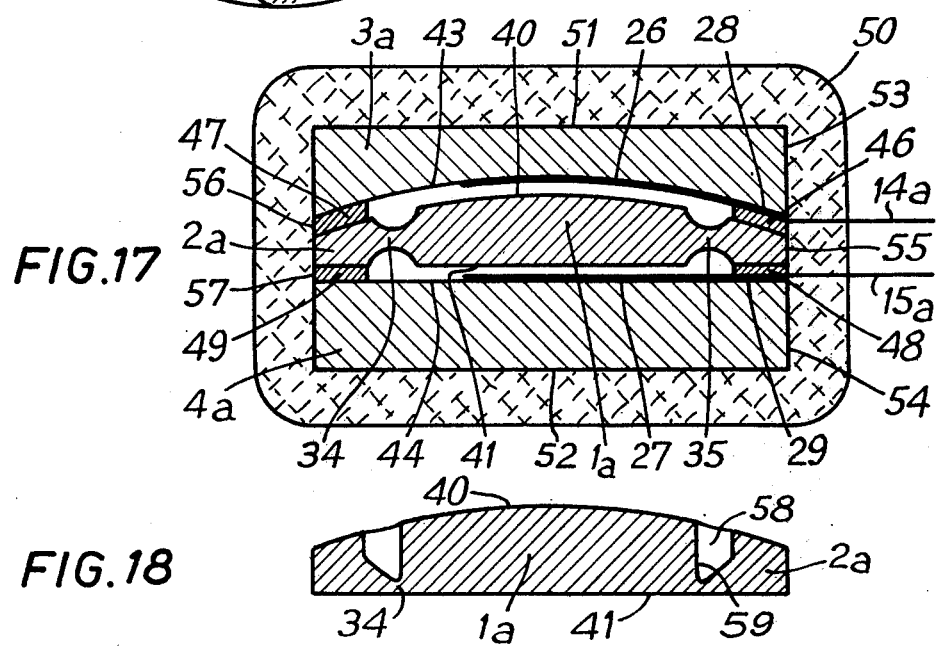
FIG. 17 is a view, in axial section, of a quartz resonator in compact form.

FIG. 17 shows an embodiment, in compact form, of a quartz resonator with electrodes that do not adhere to the crystal. In such an embodiment, the tight housing is formed by the condenser 3a, 4a itself and the portion 2a of the crystal constituting the spacing ring. The self-suspended crystal 1a, 2a, and the disks 3a, 4a are made in the manner described for the case of a quartz resonator with independent housing. However, the disks 3a, 4a are preferably made of quartz having the same orientation as the crystal. Furthermore, layers of nickel 46, 47 and 48, 49 are advantageously deposited on the faces 43 and 44 of the disks 3a and 4a, respectively, in the manner described with reference to FIGS. 15 and 16. The tight housing is, in the case of FIG. 17, formed by the outer faces 51 and 52 of the disks 3a and 4a, the side faces 53 and 54 of said same disks 3a and 4a and the edge 55 of the peripheral portion 2a of the crystal. The compact assembly formed by the parts 1a, 2a, 3a, 4a is coated in a resin 50 intended to absorb impacts. Two outgoing wires 14a and 15a, connected to the electrodes 26 and 27 deposited, respectively, on the inner faces 43 and 44 of disks 3a and 4a, emerge from the coating 50.

The disks 3a and 4a enclosing the crystal 1a are sealed at the peripheral portion 2a of the crystal, under vacuum, at a high temperture of about 480° C., while effecting a circular thermocompression in the zones of the edges 53, 54, 55, respectively, of the disks 3a and 4a and of the peripheral portion 2a located in the vicinity of the junction point 56 between said peripheral portion 2a and the disk 3a and of the junction point 57 between the peripheral portion 2a and the disk 4a. The thermocompression is effected preferably on a thin layer of gold or silver previously deposited. The electrodes 26 and 27 are connected to the metal effecting the thermocompression, respectively, at the junction point 56 and at the junction point 57. The outgoing wires 14a and 15a are themselves connected to the metal of the junction points 56 and 57, respectively. It should be noted that in FIG. 15, as well as in FIG. 17, the layers of nickel are shown with a considerably enlarged thickness for better clarity.

A resonator such as the one shown in FIG. 17 may have extremely small dimensions and volume (for example, a 5 MHz resonator has been made in the form of a disk having a diameter of 24 mm and a height of 8 mm). Furthermore, at very low temperature, and even at the liquid helium temperature, no excessive stresses occur in the crystal 1a, 2a if the disks 3a and 4a are themselves also made of quartz having the same orientation as the crystal 1a, 2a.

The quartz crystal 1a, 2a, which can be used in a quartz resonator, such as the one shown in FIG. 17, is not different from the self-suspended quartz crystals which can be used in resonators, such as the one shown in FIG. 1. Thus, the intermediate portion 34, 35, located between the peripheral portion forming the ring 2a and the active central portion 1a, is shrunk and may be provided with recesses, so that the portions 34, 35 of the intermediate portion which have not been hollowed-out form several thin bridges between the peripheral portion 2a of the crystal and the central portion 1a.

The making, in compact form, of a quartz resonator with electrodes that do not adhere to the crystal is also possible in the case of a crystal which is suspended in accordance with the embodiment shown in FIGS. 7 and 8. In this case, it is the ring 2 which plays the role of the peripheral portion 2a in FIG. 17, and a compact unit 1, 2, 3, 4 can be obtained in a manner similar to the compact unit 1a, 2a, 3a, 4a in FIG. 17.

In general, in order to reduce residual stresses at the points of suspension of the crystal by its peripheral and intermediate portions, it is possible to subject the crystal 1a, 2a to a prior treatment, prior to mounting it. For example, it is advantageous to cause the crystal to undergo annealing at about 480° C., this being followed by a very slight attack with bifluoride.

Figure 18:
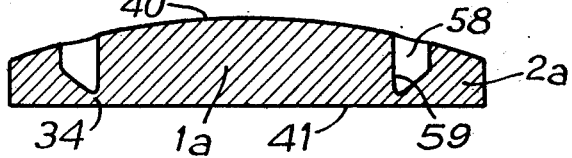
FIG. 18 is a view, in axial section, of a quartz crystal which can be incorporated in a resonator in accordance with the invention.

Moreover, if no hollowing-out is effected in the thinned-out intermediate portion and if, as a result of this, a single thin bridge 34, extending angularly over an angle of 360° completely surrounds the active portion 1a, which constitutes the simplest configuration (see FIG. 18), machining of the crystal is made extremely easier. Revolution machining, without supplementary ultrasonic machining, may be sufficient and the annular groove 58, formed in the intermediate portion of the crystal in order to obtain a thinned-out portion 34, can even be obtained by grinding only one side (for example, in FIG. 18, on the side of the face 40 of the crystal). As stated above, positioning in height of the bridges 34, 35, the height of these bridges with respect to the edge of the crystal, the width of these bridges, as well as their azimuth positioning may vary greatly, depending on the applications contemplated.

Figure 13:
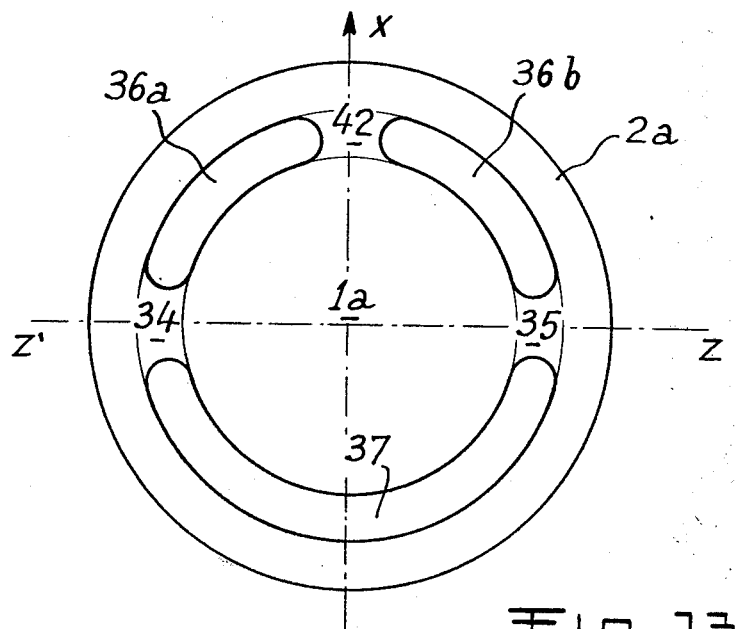

If one considers the case of a section AT (and for example, a 5 MHz crystal operating on partial mode 5), it is preferable for the intermediate portion of the crystal to comprise two thin bridges 34, 35, arranged along the axis ZZ' (projection of the axis 2) of the crystal on each side of the active central portion 1a. When manufacture is effected by means of ultrasonic machining, it is possible to obtain bridges 34, 35 the axis of which coincides with the axis ZZ', with an angular spread of less than 30 minutes of an angle. A larger number of bridges can be made. Thus, in addition to two bridges along the axis ZZ', the intermediate portion of the crystal may also comprise at least one bridge 42 along the axis X (FIG. 13). The suspension bridges may advantageously be imparted a symmetrical nature, both as regards their shape and their azimuth position. Thus, an assembly of four bridges such that two bridges be located along the axis ZZ' and two bridges be located along the axis X performs very well. Another possible angular (azimuth) distribution of the bridges, taking into account the symmetries of a quartz crystal in section AT consists in placing two bridges along the axis ZZ' and one bridge along a direction which forms an angle of 60° with the axis ZZ'.

The location of the bridges such as 34, 35, 42 with respect to the edge of the crystal may vary, depending on the applications contemplated. In general, it is preferable that the center of the bridges coincide with the nodal plane with reference mark P of the piezolectric pellet 1a, 2a, which is located at mid-height of the crystalline pellet 1a, 2a, that is to say, in the center of the thickness of the crystal, as is shown in FIGS. 19 to 21, which are partial sections through a crystal 1a, 2a, within planes containing the axis of the section of the crystal and showing various possible forms of bridges 60, 63, 66 in order to connect the peripheral portion 2a of the crystal to the active central portion 1a.

If one considers FIG. 19, one can see an example of a bridge 60 which has an upper face 71 and a lower face 72 which are parallel to each other, perpendicular to the upper portion 61 and the lower portion 62 of the edge of the active portion 1a of the crystal, and connected each respectively to the portions 61 and 62 of the edge of the crystal by a small, rounded concave portion 70 forming a radius clearance R. The bridge 60 may also be connected to the edge of the peripheral portion 2a of the crystal by small, rounded concave portions which are similar to the portions 70. The radius R of the rounded portions 70 may be less than 1 mm.

Referring to FIG. 20, there can be seen an example of a bridge 63 having an upper face 74 and a lower face 75 which converge towards the active central portion 1a, preferably at the level of the main nodal plane, referenced P, of the crystal 1a, 2a, and which are inclined by an angle alpha which is about 80° with respect to the edge 64, 65 of the active portion 1a of the crystal, said edge being itself perpendicular to the plane 8. The faces 74 and 75 of the bridge 63 are connected each respectively to the upper portion 64 and the lower portion 65 of the edge of the active portion 1a of the crystal by a small, rounded concave portion 73.

FIG. 21 shows yet another example of a type of bridge 66 which is intended to provide a slight amount of elasticity in the plane P of the crystal section while at the same time lengthening the bridge, without increasing the width of the groove arrnged between the central portion 1a and the peripheral portion 2a. The bridge 66 has an upper face 77 and a lower face 78 which are substantially parallel and which, in the plane of cross-section of FIG. 21 (plane containing the axis of the section of the crystal), have a profile which is nearly sinusoidal.

In general, the side walls such as 59 (FIG. 18), 61, 62 (FIG. 19), 64, 65 (FIG. 20), 67, 68 (FIG. 21) of the grooves 81, 82, 84, 87, 88, respectively, which determine a thinned-out intermediate portion, in particular, the walls forming the edge of the active portion 1a, are perpendicular to the main plane, referenced P, of the crystal and have a conicity of less than about 30 minutes of an angle.

Considering FIG. 22, it can be seen that the bridges 34, 35, left between the recesses 36 and 37, and connecting the active central portion 1a to the fixed peripheral portion 2a of the crystal, are radial. However, FIG. 23 shows an embodiment in which the end 34b, 35b respectively, of a bridge 34, 35, located on the side of the peripheral portion 2a is shifted by a given angle beta about the axis of the section with respect to the end 34a, 35a, respectively located on the side of the active central portion 1a, the side faces 34c and 34d, respectively 35c and 35d, of each of the bridges 34 and 35 being curved and having the same direction of curvature.

In all of the embodiments of resonators in accordance with the invention, and more particularly in the embodiments described with reference to FIGS. 9 to 13, 15 and 17 to 23, it is important that the edge of the active central portion 1a of the crystal not only be perpendicular to the reference plane of crystal 1a and have the smallest possible conicity, but it is preferable that the grit of the finishing abrasive used to form the final surface condition of the edge of the crystal 1a be very fine, of the order of a few microns. The bridges 34, 35, 42, 60, 63, 66 may themselves have a small thickness of less than a few hundred microns (less than 200 microns, for example), which makes it possible to obtain an active central portion having itself a small thickness. By ionic machining, it is possible to obtain an active portion of crystal whose thickness is less than 100 microns, which permits the use of resonators with electrodes that do not adhere to the crystal, of the type in accordance with the invention, in VHF ranges. The width of the thinned-out intermediate portion located between the central portion 1a and the peripheral portion 2a may have different values, depending on the applications contemplated. In the case of crystals having a section AT, 5 MHz, on partial mode 5, bridge widths d (FIGS. 19 to 20) of the order of 2 to 3 mm have proved to lead to good performances.

Referring once again to FIGS. 9 and 10, it is preferable that the grooves 38, 39, arranged respectively in the zones of the faces 43, 44 of the support disks 3a and 4a located opposite the intermediate portion 34, 35, 36 of the crystal 1a, 2a, be ground with abrasive grits which describe a trajectory located in a plane which passes through the axis of the crystal 1a, 2a. Moreover, in order that the electrodes 26, 27, arranged (sic) by metallization on the faces 43, 44 of the disks 3 and 4 provide electrical continuity, the condition of surface of the faces 43 and 44 must be of the order of 0.2 micron.

Piezoelectric resonators in accordance with the invention, made from natural quartz crystals whose overvoltage coefficient Q is of the order of $3.10^6$, and which operate at a frequency of 5 MHz on the partial mode 5, have an inherent stability of the order of $4.10^{-13}$ over times close to 1 s, while oscillators made with such resonators have a stability of $10^{-12}$ over 1 s, $3.10^{-12}$ over 100 s and stability lower than $10^{-11}$ per day, after several weeks of operation.

Thus, due in particular to the use of a dielectric ring made of a single piece to determine the space between two disks bearing electrodes on their inner faces, and due to the use of suspension means capable of supporting the active portion of the crystal with respect to one only of the plates or disks forming support or with respect to only the spacing ring without introducing excessive stresses without bringing about a contact of the crystal with the electrodes, and by maintaining extremely small free spacings between active crystal and electrode, the resonators in accordance with the invention have improved stability with the passage of time, while at the same time providing the possibility of convenient and accurate placing on frequency.

Various modifications and additions may, of course, be made by the man skilled in the art in the devices which have just been described, solely by way of illustration and not of limitation, without going beyond the scope of protection of the invention.

I claim:

1. A piezoelectric resonator comprising a gas tight housing, first and second disks made of a dielectric material, said disks being arranged face to face and spaced from one another; a piezoelectric crystal arranged between said first and second disks in the space therebetween in a predetermined fixed position with respect to one of the disks; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing, means for suspending the crystal in said permanent fixed position to maintain the active central portion of the crystal located opposite said first and second electrodes, said suspending means comprising means for fixing said crystal on said one of said first and second disks in said predetermined position at a spaced distance of between 0.5 and 50 microns, said mounting means comprising means for insuring that said space between the crystal and the disk to which it is fixed remains the same upon disassembly and reassembly of the resonator; means for maintaining the assembly of said first and second disks in position inside the housing; and removable bracing means positioned between and engaging said first and second disks for maintaining said disks spaced from one another; said bracing means being formed only of a single ring made of a dielectric material which surrounds, at a distance, the active central portion of said crystal and having a height such that the free spacing provided between the active central portion of the crystal and the electrode on the disk to which the crystal is not fixed has a controllable thickness of less than a few dozen microns.

2. A resonator according to claim 1, wherein the radius of curvature of at least one of the faces of the first and second disks on which the first and second electrode are respectively deposited is different from the radius of curvature of the corresponding face of the crystal placed opposite same.

3. A resonator according to claim 1 wherein the spacing ring is made of silica.

4. A piezoelectric resonator comprising a gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing, means for suspending the crystal to maintain the active central portion of the crystal located opposite said first and second electrodes in a predetermined fixed position with respect to at least one of said first and second disks; means for maintaining the assembly of said first and second disks in position inside the housing; and removable bracing means for maintaining said first and second disks spaced from one another; said bracing means being formed of a single ring made of a dielectric material which surrounds, at a distance, the active central portion of said crystal and having a height such that the free spacings provided between the active central portion of the crystal and the first and second electrode, respectively, have a thickness of less than a few dozen microns; said at least one of said first and second disks having two slightly conical holes formed therein and includes two hollow metal pieces having the same conicity as the holes and having roughnesses on their outer surface, being respectively received in said holes and thin metal strips fastened to the edge of the crystal and engaged in the hollow pieces; said strips being welded to the hollow pieces to effect the suspension of the crystal with respect to the disk.

5. A resonator according to claim 4, wherein the thin metal strips are made of nickel.

6. A resonator according to claim 5, wherein the hollow metal pieces are made of nickel.

7. A resonator according to claim 4 wherein the thin metal strips are fastened to the edge of the crystal by thermocompression.

8. A resonator according to claim 4 to wherein the thin metal strips are fastened to the edge of the crystal by means of a cement.

9. A resonator according to claim 4 wherein the conical holes correspond to cones whose angle is close to 1°.

10. A piezoelectric resonator comprising tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing; means for suspending the crystal to maintain the active central portion of the crystal located opposite said first and second electrodes in a predetermined fixed position with respect to at least one of said first and second disks; means for maintaining the assembly of said first and second disks in position inside the housing; and removable bracing means for maintaining said first and second disks spaced from one another; said bracing means being formed of a single ring made of a dielectric material which surrounds, at a distance, the active central portion of said crystal and having a height such that the free spacings provided between the active central portion of the crystal and the first and second electrode, respectively, have a thickness of less than a few dozen microns; said at least one of said first and second disks being made of a piezoelectric material which is identical to the material forming the crystal, and said means for suspending the crystal in said predetermined position with respect to said at least one disk suspends the crystal on said at least one disk in a fixed position and comprises metallic layers rigidly secured by a thermocompression on localllized portions of the faces of the crystal and of the support disk located opposite one another.

11. A piezoelectric resonator comprising a gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing, means for suspending the crystal to maintain the active central portion of the crystal located opposite said first and second electrodes in a predetermined position with respect to at least one of said first and second disks; means for maintaining the assembly of said first and second disks in position inside the housing; and removable bracing means for maintaining said first and second disks spaced from one another; said bracing means being formed of a single ring made of a dielectric material which surrounds at a distance, the active central portion of said crystal and having a height such that the free spacings provided between the active central portion of the crystal and the first and second electrode, respectively, have a thickness of less than a few dozen microns; said spacing ring being piezoelectric and including electrodes formed by metallization on each of its frontal faces, so that the thickness of the ring can be modulated slightly by the application of an electrical voltage on said electrodes.

12. A piezoelectric resonator comprising a separate gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing; means for suspending the crystal to maintain the active central portion of the crystal located opposite said first and second electrodes in a predetermined fixed position with respect to at least one of said first and second disks; means for maintaining the assembly of said first and second disks in position inside the housing; and removable bracing means for maintaining said first and second disks spaced from one another; said bracing means positioned between and engaging peripheral portions of said disks and being formed of a single ring made of a dielectric material which surrounds, at a distance, the active central portion of said crystal and having a height such that the free spacings provided between the active central portion of the crystal and the first and second electrode, respectively, have a thickness of less than a few dozen microns; said spacing ring surrounding at a distance the active central portion of the crystal and determining the space between the first and second disk being formed by a peripheral portion of the crystal itself; said peripheral portion of the crystal being complementary to and in mating contact with said peripheral portions of said disks but unsecured thereto; said crystal including a single intermediate portion between said active central portion and said peripheral portion constituting the ring, said intermediate portion having at least two recesses formed therein by ultrasonic machining between the active central portion and the peripheral portion, whereby the peripheral portion of the crystal is connected to the central portion of the crystal by a limited number of bridges defining said means for suspending the crystal; said bridges being thinned down by grinding to a thickness less than that of the crystal to provide a mechanical fitting between the immobolized peripheral portion of the crystal and the active central portion which permits said central portion to vibrate.

13. A resonator according to claim 12, wherein a portion of the surface of at least one of said first and second disks bearing the electrode and located opposite the central and intermediate portions of the crystal is recessed with respect to the peripheral portion of the same surface which is in contact with the peripheral portion of the crystal, and forms a recess the depth of which is between a few tenths of a micron and a few dozen microns.

14. A resonator according to claim 12 wherein the faces of the first and second disks opposite the crystal have, in the portion located opposite said intermediate portion of the crystal, grooves formed therein, the depth of which is greater than the thickness of the free spacings included between the active central portion of the crystal and the first and second electrode, respectively.

15. A resonator according to claim 13, wherein said recessed portion of the surface of said at least one of said first and second disks has a radius of curvature which is smaller than the radius of curvature of the corresponding face of the crystal placed opposite of said at least one disk and said peripheral portion of said surface of said at least one of said first and second disks having a radius of curvature which is equal to that of the corresponding surface of the crystal located opposite said at least one disk.

16. A resonator according to claim 12 wherein the face of at least one disk facing towards the crystal include, over at least part of its periphery, located opposite the peripheral portion of the crystal, at least one metal pad deposited by electrolysis secured to said one disk and having a surface facing said crystal which is complementary and engages, but is not secured to, the adjacent surface of the periphery of the crystal to provide a predetermined gap between the crystal and the one disk.

17. A resonator according to claim 16 wherein said thin layer is formed of nickel deposited by electrolysis on said crystal.

18. A resonator according to claim 12 wherein said means for maintaining the assembly formed by said first and second disks in position inside the housing comprises mechanical clamping members acting on the faces of said first and second disks not located opposite the crystal, in peripheral zones, located to apply pressure on the crystal in zones of said peripheral portion of the crystal which are at a distance from the connecting bridges between said central and peripheral portions.

19. A resonator according to claim 12 wherein the bridges are arranged, with respect to the edge of the crystal such that the center of the bridges substantially coincide with the nodal plane of reference of the crystal, which is located immediately in the center of the thickness of the crystal.

20. A resonator according to claim 12 wherein the piezoelectric crystal is a quartz crystal of section AT, and the intermediate portion of the crystal comprises two bridges arranged on each side of the active central portion, along the axis ZZ'.

21. A resonator according to claim 20, wherein the intermediate portion of the crystal furthermore comprises at least one bridge arranged along the axis X.

22. A resonator according to claim 20, wherein the intermediate portion of the crystal includes two bridges arranged on each side of the active central portion, along the axis X.

23. A resonator according to claim 20, wherein the intermediate portion of the crystal includes at least one bridge arranged along a direction which is angularly shifted by 60° with respect to the axis ZZ'.

24. A resonator according to claim 12 wherein the bridges have, in cross-section, an upper edge and a lower edge which are parallel to one another, perpendicular to the edge of the crystal and connected to said edge by a rounded concave portion.

25. A resonator according to claim 12 wherein the bridges connecting the peripheral portion of the crystal to the active central portion have acute end portions located adjacent the peripheral portion of the crystal shifted by a predetermined angle with respect to their inner end portions located adjacent the active central portion of the crystal and have curved side faces with the same direction of curvature.

26. A resonator according to claim 12 wherein the bridges located in the intermediate portion of the crystal have lower and upper edges with one of these edges defining an extension of the respectively lower or upper face of the active central portion of the crystal.

27. A resonator according to claim 12 wherein the side walls of the thinned intermediate portion of the crystal respectively form the inner and outer edges of the peripheral and central portions of the piezoelectric crystal and are substantially perpendicular to the main plane of reference of the crystal and have a conicity less than about 30 minutes of an angle.

28. A resonator according to claim 12 wherein the bridges connecting the peripheral portion of the crystal to the active central portion extend radially.

29. A piezoelectric resonator comprising a separate gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing; means for suspending the crystal to maintain the active central portion of the crystal located opposite said first and second electrodes in a predetermined fixed position with respect to at least one of said first and second disks; means for maintaining the assembly of said first and second disks in position inside the housing; and removal bracing means for maintaining said first and second disks spaced from one another; said bracing means being positioned between and engaging peripheral portions of said disks and being formed of a single ring made of a dielectric material which surrounds, at a distance, the active central portion of the crystal and having a height such that the free spacings provided between the active central portion of the crystal and the first and second electrode, respectively, have a thickness of less than a few dozen microns; said spacing ring surrounding at a distance the active central portion of the crystal and determining the space between the first and second disks being formed by a peripheral portion of the crystal itself; said peripheral portion of the crystal being complementary to and in mating contact with said peripheral portions of said disks but unsecured thereto; said crystal including an intermediate portion between said active central portion and said peripheral portion constituting the ring, said intermediate portion having at least one part, between the active central portion and the peripheral portion, whose thickness is small compared with the thickness of said central and peripheral portion; said means for suspending the crystal being formed by said intermediate portion of the crystal; a portion of the surface of at least one of the faces of the crystal corresponding to the central and intermediate portions of the crystal being recessed with respect to the portion of the same surface corresponding to the peripheral portion in mating contact with said first and second disks, and forming a recess the depth of which is between a few tenths of a micron and a few dozen microns.

30. A piezoelectric resonator comprising a separate gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing; means for suspending the crystal to maintain the active central portion of the crystal located opposite said first and second electrodes in a predetermined fixed position with respect to at least one of said first and second disks; means for maintaining the assembly of said first and second disks in position inside the housing; and removal bracing means for maintaining said first and second disks spaced from one another; said bracing means being positioned between and engaging peripheral portions of said disks and being formed of a single ring made of a dielectric material which surrounds, at a distance, the active central portion of the crystal having a height such that the free spacings provided between the active central portion of the crystal and the first and second electrode, respectively, have a thickness of less than a few dozen microns; said spacing ring surrounding at a distance the active central portion of the crystal and determining the space between the first and second disks being formed by a peripheral portion of the crystal itself; said peripheral portion of the crystal being complementary to and in mating contact with said peripheral portions of said disks but unsecured thereto; said crystal including an intermediate portion between said active central portion and said peripheral portion constituting the ring, said intermediate portion having at least one part, between the active central portion and the peripheral portion, whose thickness is small compared with the thickness of said central and peripheral portion; said means for suspending the crystal being formed by said intermediate portion of the crystal; said thin intermediate portion being formed by a single groove whose shape and location with respect to the edge of the crystal result in a mechanical fitting between the immobilized peripheral portion of the crystal and permits the active central portion to vibrate.

31. A piezoelectric resonator comprising a gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing, means for suspending the crystal to maintain the active central portion of the crystal located opposite said first and second electrodes in a predetermined position with respect to at least one of said first and second disks; means for maintaining the assembly of said first and second disks in position inside the housing; and removable bracing means for maintaining said first and second disks spaced from one another; said bracing means being formed of a single ring made of a dielectric material which surrounds at a distance, the active central portion of said crystal and having a height such that the free spacings provided between the active central portion of the crystal and the first and second electrode, respectively, have a thickness of less than a few dozen microns; said spacing ring surrounding at a distance the active central portion of the crystal and determining the space between the first and second disk being formed by a peripheral portion of the crystal itself; said crystal including an intermediate portion between said active central portion and said peripheral portion constituting the ring, said intermediate portion having at least on part of the distance between the active central portion and the peripheral portion, a thickness which is small, compared with the thickness of said central and peripheral portion; and said means for suspending the crystal being formed by the intermediate and peripheral portions of the crystal; said thinned intermediate portion of the crystal being formed by a single groove whose shape and location with respect to the edge of the crystal result in a mechanical fitting between the immobilized peripheral portion of the crystal and permits the active central portion to vibrate; said crystal having recesses formed therein by ultrasonic machining in the thinned intermediate portion therof whereby the peripheral portion of the crystal is connected to the central portion of the crystal by a limited number of bridges formed by the thin portions of the intermediate portion between the recesses; said bridges having, in cross section, an upper edge and a lower edge which converge towards the active central portion of the crystal and are inclined about 80° with respect to the edge of the crystal.

32. A piezoelectric resonator comprising a gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor to the first electrode and extending outside the housing; a second conductor connected to the second electrode and extending outside the housing, means for suspending the crystal to maintain the active central portion of the crystal located opposite said first and second electrodes in a predetermined position with respect to at least one of said first and second disks; means for maintaining the assembly of said first and second disks in position inside the housing; and removable bracing means for maintaining said first and second disks spaced from one another; said bracing means being formed of a single ring made of a dielectric material which surrounds at a distance, the active central portion of said crystal and having a height such that the free spacings provided between the active central portion of the crystal and the first and second electrode, respectively, have a thickness of less than a few dozen microns; said spacing ring surrounding at a distance the active central portion of the crystal and determining the space between the first and second disk being formed by a peripheral portion of the crystal itself; said crystal including an intermediate portion between said active central portion and said peripheral portion constituting the ring, said intermediate portion having at least on part of the distance between the active central portion and the peripheral portion, a thickness which is small, compared with the thickness of said central and peripheral portion; and said means for suspending the crystal being formed by the intermediate and peripheral portions of the crystal; said thinned intermediate portion of the crystal being formed by a single groove whose shape and location with respect to the edge of the crystal result in a mechanical fitting between the immobilized peripheral portion of the crystal and permits the active central portion to vibrate; said crystal having recesses formed therein by ultrasonic machining in the thinned intermediate portion thereof whereby the peripheral portion of the crystal is connected to the central portion of the crystal by a limited number of bridges formed by the thin portions of the intermediate portion between the recesses; said bridges having, in cross section, an upper edge and a lower edge which are parallel and have a substantially sinusoidal profile.

33. A piezoelectric resonator compris a gas tight housing, first and second disks made of a dielectric material, arranged face to face and spaced from one another; a piezoelectric crystal arranged between said first and second disks in the space therebetween; a first non-adhering metal electrode formed by metallization on the face of the first disk opposite the crystal; a second non-adhering metal electrode formed by metallization on the face of the second disk opposite the crystal; a first conductor connected to the first electrode and extending outside the housing; a second conductor connected to the second electrode and extending outside the housing, means for suspending the crystal to maintain the active central portion of the crystal located opposite said first and second electrodes in a predetermined position with respect to at least one of said first and second disks; means for maintaining the assembly of said first and second disks in position inside the housing; and removable bracing means for maintaining said first and second disks spaced from one another; said bracing means are formed of a single ring made of a dielectric material which surrounds, at a distance, the active central portion of said crystal and having a height such that the free spacings provided between the active central portion of the crystal and the first and second electrode, respectively, have a thickness of less than a few dozen microns; the connection of at least one of said first and second conductors connected respectively to the first and the second electrode being formed by means of a terminal made of nickel and one end of which is welded to said at least one conductor and the other end of which is conical and fitted into a conical home in the disk bearing the electrode which corresponds to the said conductor.

* * * * *